United States Patent
Souto Diez

(10) Patent No.: US 8,761,703 B2
(45) Date of Patent: Jun. 24, 2014

(54) VARIABLE-GAIN MIXER FOR A WIRELESS RECEIVER WITH CURRENT COMPENSATION

(75) Inventor: Anabel Souto Diez, Grasse (FR)

(73) Assignee: Accent S.p.A., Vimercate (IT)

( * ) Notice: Subject to any disclaimer, the term of this patent is extended or adjusted under 35 U.S.C. 154(b) by 0 days.

(21) Appl. No.: 13/977,237

(22) PCT Filed: Dec. 28, 2011

(86) PCT No.: PCT/EP2011/074130
§ 371 (c)(1),
(2), (4) Date: Sep. 9, 2013

(87) PCT Pub. No.: WO2012/089755
PCT Pub. Date: Jul. 5, 2012

(65) Prior Publication Data
US 2013/0344834 A1    Dec. 26, 2013

Related U.S. Application Data

(60) Provisional application No. 61/427,792, filed on Dec. 28, 2010.

(30) Foreign Application Priority Data

Dec. 29, 2010  (IT) ............................... MI2010A2438
Feb. 21, 2011  (IT) ............................... MI2011A0259

(51) Int. Cl.
*H04B 1/06* (2006.01)
*H02M 11/00* (2006.01)

(52) U.S. Cl.
USPC .......... 455/245.1; 455/313; 327/103; 327/356

(58) Field of Classification Search
USPC ........... 455/131, 232.1, 245.1, 313, 333, 334; 327/102, 103, 355, 356; 375/345
See application file for complete search history.

(56) References Cited

U.S. PATENT DOCUMENTS

| 5,867,778 A | 2/1999 | Khoury et al. |
| 5,933,771 A | 8/1999 | Tiller et al. |
| 5,995,819 A | 11/1999 | Yamaji et al. |
| 6,396,330 B1 | 5/2002 | Fujii |

(Continued)

OTHER PUBLICATIONS

International Search Report for PCT application No. PCT/EP2011/074130; Apr. 18, 2012, Rijswijk, Holland; 4 pages.

*Primary Examiner* — Quochien B Vuong
(74) *Attorney, Agent, or Firm* — Bryan A. Santarelli; Graybeal Jackson LLP

(57) ABSTRACT

An embodiment of a variable-gain mixer for down-converting a modulated input signal into a modulated output signal in a wireless receiver is proposed. The mixer includes means for selecting a mixer gain according to a power level of the input signal, amplifying means for amplifying the input signal into a modulated intermediate current ($I_{RF}+$, $I_{RF}-$) in response to a control signal indicative of the selected mixer gain, the intermediate current having an intermediate component, consisting of a direct current, varying according to the selected mixer gain, means for generating the output signal from the intermediate current, the output signal having an output component, consisting of a direct current or voltage, depending on the intermediate component; in an embodiment, the mixer further includes means for setting a compensation current in response to the control signal for compensating the variation of the intermediate component, and means for adding the compensation current to the intermediate current.

10 Claims, 5 Drawing Sheets

(56) References Cited

U.S. PATENT DOCUMENTS

| | | |
|---|---|---|
| 6,590,438 B1 | 7/2003 | Manku et al. |
| 6,711,396 B1 | 3/2004 | Bergsma et al. |
| 6,812,771 B1 * | 11/2004 | Behel et al. .................. 327/356 |
| 6,892,062 B2 | 5/2005 | Lee et al. |
| 6,917,788 B2 | 7/2005 | Malhi et al. |
| 7,035,616 B2 * | 4/2006 | Reynolds .................. 455/313 |
| 2006/0057991 A1 | 3/2006 | Behzad et al. |
| 2007/0142018 A1 | 6/2007 | Lin et al. |

* cited by examiner

VARIABLE-GAIN MIXER FOR A WIRELESS RECEIVER WITH CURRENT COMPENSATION

PRIORITY CLAIM

The present application is a national phase application filed pursuant to 35 USC §371 of International Patent Application Serial No. PCT/EP2011/074130, filed Dec. 28, 2011; which further claims the benefit of the U.S. Provisional Patent Application Ser. No. 61/427,792 filed Dec. 28, 2010, now expired; and further claims benefit of Italian Patent Application No. MI2010A002438, filed Dec. 29, 2010, and claims benefit of Italian Patent Application No. MI2011A000259, filed Feb. 21, 2011, all of the foregoing applications are incorporated herein by reference in their entireties.

TECHNICAL FIELD

One or more embodiments relate to the wireless communication field. More specifically, one or more embodiments relate to variable-gain mixers for wireless receivers.

SUMMARY

Wireless receivers are commonly used in a number of applications to receive information being transmitted using electromagnetic waves (for example, in smart-grid applications). Generally, a wireless receiver is based on the super-heterodyne architecture, wherein a radio-frequency (RF) modulated signal, or simply RF signal (on a carrier having a variable frequency depending on a selected communication channel) is down-converted into an intermediate-frequency (IF) modulated signal, or simply IF signal (on a carrier having a fixed frequency); this significantly simplifies the downstream components of the receiver (since they may be designed to work at lower frequency, thereby simplifying their analog design and avoiding the typical tradeoffs required at radio-frequency). For this purpose, the receiver generally includes a mixer, which mixes (i.e., multiplies) the RF signal with a Local (LO) signal (having a variable frequency that differs from the one of the RF signal by the frequency of the IF signal), so as to obtain the IF signal (always with the same frequency equal to the difference of their frequencies).

In a wireless receiver, the RF signal typically exhibits a large variation of its power level—for example, in a range from some picowatts (pW) to some milliwatts (mW) (such as because of variable losses due to different characteristics and lengths of corresponding communication paths). In order to cope with this problem, the different blocks in a chain of the receiver may be implemented with variable gains (which are adapted dynamically to the power level of the RF signal). The gains are set to provide a good tradeoff between noise and linearity in the receiver chain. Indeed, higher gains in the first blocks of the receiver chain improve the noise but degrade the linearity of the receiver, whereas higher gains in the last blocks of the receiver chain improve the linearity but degrade the noise of the receiver. The mixer is placed in the middle of the receiver chain, and it is then a very important block thereof, since its gain, noise, and linearity determine the performance requirements of its neighbor blocks.

However, the variability of the mixer gain may cause a degradation of its linearity, with a corresponding distortion in the IF signal; moreover, this may increase the noise that is added to the IF signal. All of the above has a detrimental effect on the performance of the mixer, and then of the whole receiver.

For example, the mixer is generally implemented with a transconductance stage (which amplifies an RF voltage defining the RF signal into an RF current), a multiplication stage (which multiplies the RF current by the LO signal so as to obtain an IF current), and a loading stage (which provides an IF voltage defining the IF signal from the IF current). The variable mixer gain may be achieved by varying either a transconductance gain of the transconductance stage or a load of the loading stage. However, any change in the transconductance gain of the transconductance stage involves a corresponding change in a common mode component of the RF current and the IF current (or simply common mode current), and then a change in a common mode component of the IF voltage (or simply output common mode). Therefore, since the multiplication stage has to be designed to be able to support a maximum common mode current that may be provided at the highest transconductance gain, it is oversized when the common mode current is lower (as a result of a reduction of the mixer gain); in this condition, flicker noise that is added to the IF current increases. Moreover, any increase of the common mode current on the load at high mixer gain setting causes a corresponding increase in the voltage drop on the load, and then it reduces the voltage that is available for the lower stages of the mixer (i.e., the transconductance stage and the multiplication stage); this may impair the correct operation of transistors of the mixer, especially in low power applications (wherein the receiver is supplied with a low power supply voltage). On the contrary, any reduction of the common mode current at low mixer gain setting causes an increase of the output common mode, and then it reduces the room for the swing of the IF voltage, thereby reducing the linearity of the mixer.

This variation in the output common mode with the mixer gain setting may also cause biasing problems in the downstream components of the receiver. This would require the addition of decoupling capacitors; these decoupling capacitors should have a relatively high capacitance (since they should not filter the IF signal at relatively low frequency), so that they are big and then significantly increase the size of the receiver. Moreover, the addition of the decoupling capacitors is not of general applicability (since it may be not possible in specific applications).

Some techniques have been proposed in the art in an attempt to overcome some of these drawbacks; however, the proposed techniques generally address only one of the aspects pointed out above, and generally at the cost of worsening the performance of the mixer with respect to the other ones (i.e., size, current consumption, noise or linearity).

For example, U.S. Pat. No. 6,917,788 (the entire disclosure of which is herein incorporated by reference) proposes a transconductance stage with an emitter degeneration architecture to improve the linearity of the mixer (i.e., with the addition of resistors or inductors between the emitters of its transistors and a direct current generator to implement a negative feedback); however, the emitter degeneration architecture with resistors inherently increases the noise of the mixer, whereas the emitter degeneration architecture with inductors increases its size.

Alternatively, US-A-2007/0142018 (the entire disclosure of which is herein incorporated by reference) proposes adding a common mode feedback circuit that regulates the output common mode, so as to reduce the flicker noise of the mixer; however, this adversely affects the linearity of the mixer, and increases its power consumption.

U.S. Pat. No. 5,933,771 (the entire disclosure of which is herein incorporated by reference) instead proposes a mixer wherein the transconductance stage and the multiplication stage are combined together (by arranging a current source in parallel to the multiplication stage); however, this structure suffers the same drawbacks pointed out above.

U.S. Pat. No. 6,396,330 (the entire disclosure of which is herein incorporated by reference) proposes a cross-coupling structure wherein, in a complementary pair of bipolar transistors implementing the transconductance stage, a base terminal of each bipolar transistor (receiving a corresponding component of the RF voltage) is coupled to a collector terminal of the other bipolar transistor (providing the complementary component of the RF current) through an inductance (for example, a capacitor, a resistor, or an RLC network). This technique allows reducing the distortion of the transconductance stage (but it is completely ineffective for the other drawbacks pointed out above).

U.S. Pat. No. 6,892,062 (the entire disclosure of which is herein incorporated by reference) proposes a current-reuse bleeding mixer, wherein an active block operates as a bleeding current source for direct current and as a transconductance amplifier for alternate current. This allows reducing the flicker noise, but increases the power consumption.

Moreover, US-A-2006/0057991 (the entire disclosure of which is herein incorporated by reference) proposes the introduction of a LOFT (Local Oscillator Feed Through) compensation to cancel the offset current that is noted in the mixer.

In its general terms, one or more embodiments is based on the idea of adding a compensation current.

Particularly, one or more embodiments are set out in the independent claims, with advantageous features of the same solution that are set out in the dependent claims, whose wording is herein incorporated verbatim by reference (with any advantageous feature provided with reference to a specific aspect of an embodiment that applies mutatis mutandis to every other aspect thereof).

More specifically, an embodiment is a variable-gain mixer; the mixer is used to down-convert a modulated input signal into a modulated output signal in a wireless receiver (for example, from a differential RF voltage to in-phase and quadrature components of a differential IF voltage). The mixer includes means for selecting a mixer gain according to a power level of the input signal (for example, a corresponding control block). Amplifying means is provided for amplifying the input signal into a modulated intermediate current in response to a control signal indicative of the selected mixer gain (for example, a switchable transconductance stage providing a differential RF current from the differential RF voltage); the intermediate current has an intermediate component, consisting of a direct current (for example, a common mode current), varying according to the selected mixer gain. Moreover, means is provided for generating the output signal from the intermediate current (for example, a multiplying stage based on a Gilbert cell that provides in-phase and quadrature components of a differential IF current, multiplying the differential RF current by a differential LO signal, and a loading stage that provides in-phase and quadrature components of the differential IF voltage from the corresponding components of the IF current); the output signal has an output component, consisting of a direct current or voltage (for example, a common mode voltage), depending on the intermediate component. In an embodiment, the mixer further includes means for setting a compensation current in response to the control signal (for example, by selectively enabling compensating transistors associated with amplifying transistors of the transconductance state when these amplifying transistors are disabled to reduce the mixer gain); the compensation current is set to compensate the variation of the intermediate component (i.e., to maintain the common mode current constant as the selected mixer gain changes). Means are then provided for adding the compensation current to the intermediate current (for example, with the compensating transistors that are coupled in parallel to the amplifying transistors).

A further embodiment is a receiver including one or more of these mixers.

Another embodiment is a corresponding method.

BRIEF DESCRIPTION OF THE DRAWINGS

One or more embodiments, as well as features and the advantages thereof, will be best understood with reference to the following detailed description, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). Particularly.

DETAILED DESCRIPTION

Figure 1:
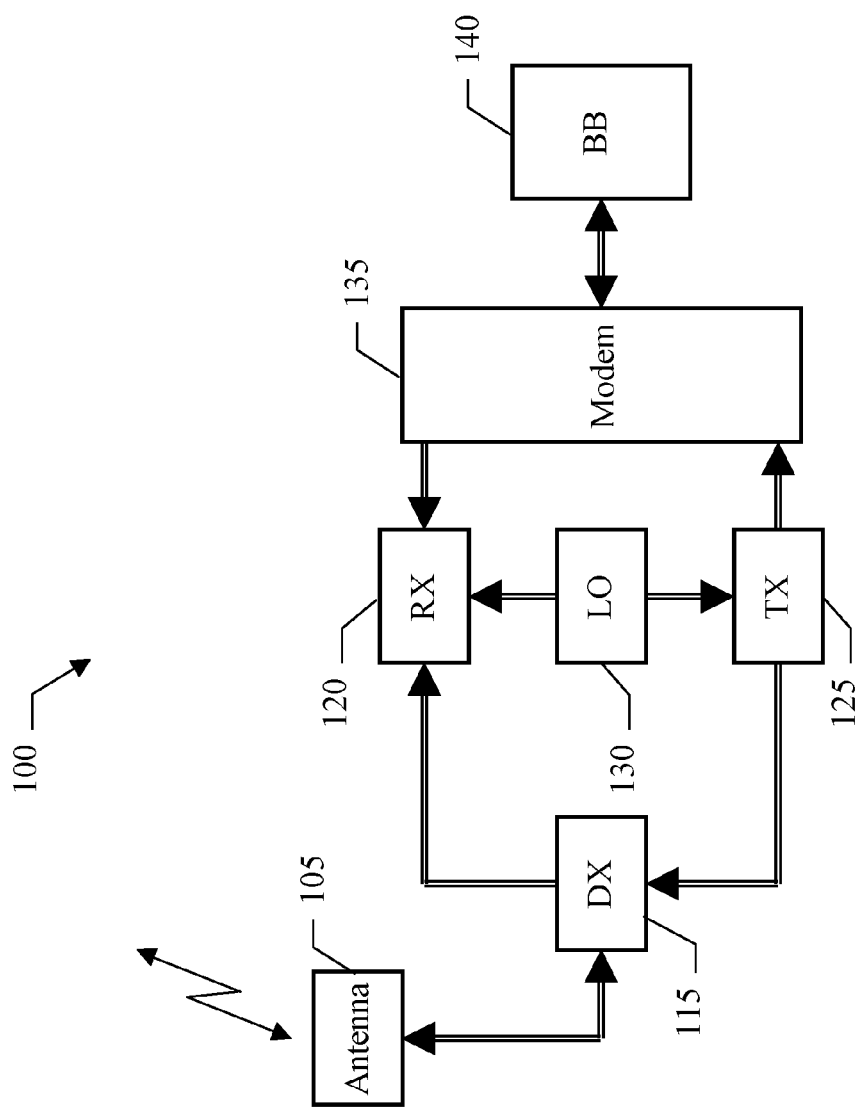
FIG. 1 shows a schematic block diagram of a wireless transceiver, according to an embodiment.

With reference in particular to FIG. 1, there is shown a schematic block diagram of a wireless transceiver 100 wherein an embodiment may be used; for example, the wireless transceiver 100 may be used in smart-grid applications, such as in a smart meter (not shown in the figure) to exchange information between the smart meter and a central system (for example, to collect consumption information and to control energy delivery remotely).

The wireless transceiver 100 includes an antenna 105 for receiving and transmitting modulated RF signals, or simply RF signals (for example, on a carrier with a frequency around 900 MHz, according to a selected communication channel). The antenna 105 interfaces with a duplexer (DX) 115, which selectively transfers an RF signal being received (referred to as ingoing RF signal) from the antenna 105 to a receiver (RX) 120 of the wireless transceiver 100 (when it operates in receiving mode), or an RF signal to be transmitted (referred to as outgoing RF signal) to the antenna 105 from a transmitter (TX) 125 of the wireless transceiver 100 (when it operates in transmitting mode). A local oscillator (LO) 130 provides an LO signal with a frequency variable according to the selected communication channel, which is used (as described in the following) to convert the ingoing RF signal into a signal at a fixed intermediate frequency (referred to as ingoing IF signal) in the receiver 120, or to obtain the outgoing RF signal from a signal at the same fixed intermediate frequency (referred to as outgoing IF signal) in the transmitter 125. Both the receiver 120 and the transmitter 125 interface with a modem 135, which performs modulation and demodulation operations (on digital signals corresponding to the ingoing IF signal and the outgoing IF signal, respectively). The modem 135 in turn interfaces with a baseband (BB) processor 140, which processes the information being received and to be transmitted according to the specific application of the wireless transceiver 100.

Figure 2:
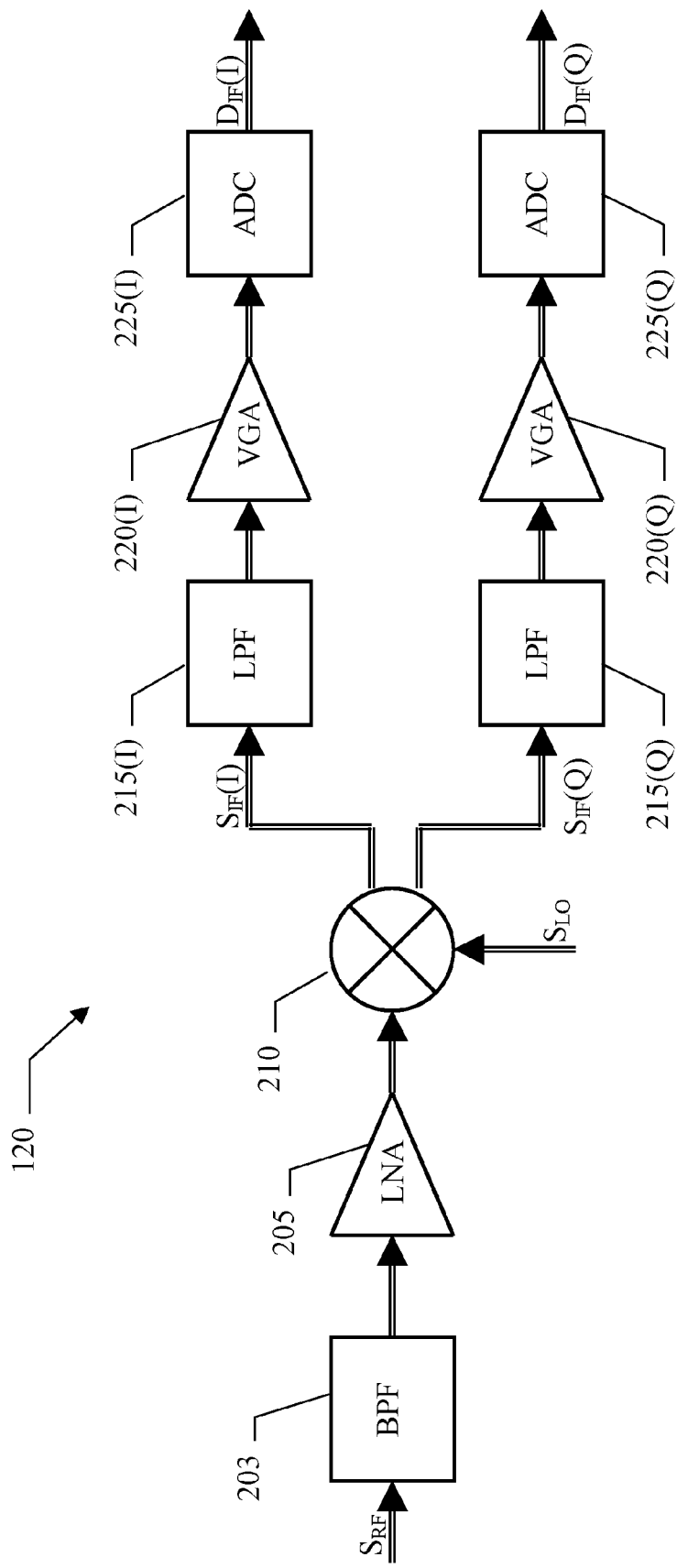
FIG. 2 shows a schematic block diagram of a receiver of this wireless transceiver, according to an embodiment.

A schematic block diagram of the receiver 120 (of this wireless transceiver) wherein an embodiment may be used is shown in FIG. 2.

Particularly, the receiver 120 includes a band-pass filter (BPF) 203, which removes out-of-band spurious components from the ingoing RF signal, or simply RF signal (denoted with $S_{RF}$). The band-pass filter 203 supplies the (filtered) RF signal $S_{RF}$ to a low-noise amplifier (LNA) 205, which amplifies the (very weak) RF signal $S_{RF}$ reducing its noise. The receiver 120 also includes a variable-gain mixer 210, which receives the (amplified) RF signal $S_{RF}$ from the low-noise amplifier 210, and the LO signal (denoted with $S_{LO}$) from the local oscillator (not shown in the figure); as described in the following, the mixer 210 mixes the RF signal $S_{RF}$ with the LO signal $S_{LO}$, so as to obtain an in-phase (I) component and a quadrature (Q) component of the ingoing IF signal (referred to as IF signals $S_{IF}(I)$ and $S_{IF}(Q)$, respectively) with a mixer gain $Gv=S_{IF}(I)/S_{FR}=S_{IF}(Q)/S_{FR}$ depending on the corresponding power level. Each IF signal $S_{IF}(I),S_{IF}(Q)$ is supplied to a low-pass filter (LPF) 215(I),215(Q), which filters it into a bandwidth corresponding to the intermediate frequency. The low-pass filter 215(I),215(Q) supplies the (filtered) IF signal $S_{IF}(I),S_{IF}(Q)$ to a variable-gain amplifier (VGA) 220(I),220(Q), which amplifies it with a gain depending on the corresponding power level. An analog-to-digital converter (ADC) 225(I),225(Q) converts the (amplified) IF signal $S_{IF}(I),S_{IF}(Q)$ from the variable-gain amplifier 220(I), 220(Q) into a digital signal $D_{IF}(I),D_{IF}(Q)$, which is supplied to the modem (not shown in the figure).

Figure 3:
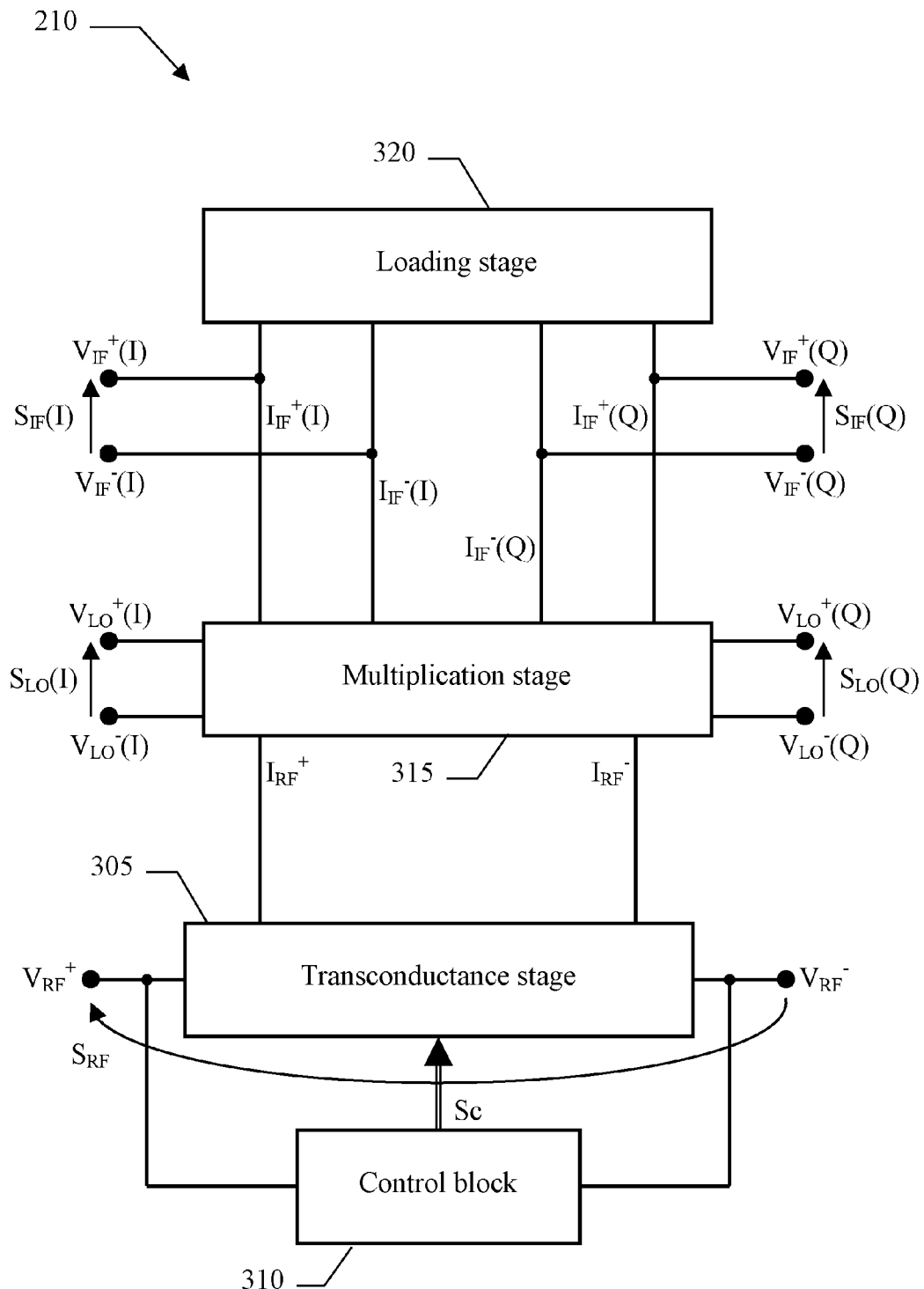
FIG. 3 shows a schematic block diagram of a mixer of this receiver, according to an embodiment.

A schematic block diagram of the mixer 210 (of this receiver) wherein an embodiment may be applied is shown in FIG. 3.

Particularly, the mixer 210 includes a transconductance stage 305 with a differential architecture; the transconductance stage 305 receives an input signal consisting of an RF voltage (defining the RF signal $S_{RF}$), which is equal to the difference of its differential components (again referred to as RF voltages) $V_{RF}^+$ and $V_{RF}^-$ —with the RF voltages $V_{RF}^+$ and $V_{RF}^-$ that have a common mode component equal to $$\frac{V_{RF}^+ + V_{RF}^-}{2}.$$

The transconductance stage 305 amplifies the RF voltages $V_{RF}^+$ and $V_{RF}^-$ into corresponding differential components (referred to as RF currents) $I_{RF}^+$ and $I_{RF}^-$ of an intermediate current—with the RF currents $I_{RF}^+$ and $I_{RF}^-$ that have a common mode component (referred to as common mode current $I_{CM}$). The transconductance stage 305 has a variable transconductance gain $g_{mT}=I_{RF}^+/V_{RF}^+=I_{RF}^-/V_{RF}^-$. A control block 310 is coupled with the transconductance stage 305 for sensing a power level of the RF signal $S_{RF}$, and for controlling the transconductance gain $g_{mT}$ accordingly (i.e., by increasing or decreasing the transconductance gain $g_{mT}$ when the power level is low or high, respectively) by means of a corresponding control signal Sc.

The mixer 210 also includes a multiplication stage based on an active Gilbert cell 315. The multiplication stage 315 receives the RF currents $I_{RF}^+$ and $I_{RF}^-$ from the transconductance stage 305. The multiplication stage 315 also receives two LO voltages (defining the quadrature LO signals $S_{LO}(I)$ and $S_{LO}(Q)$, respectively), each one being equal to the difference of its differential components (again referred to as LO voltages) $V_{LO}^+(I),V_{LO}^+(Q)$ and $V_{LO}^-(I),V_{LO}^-(Q)$. The multiplication stage 315 multiplies each RF current $I_{RF}^+$ and $I_{RF}^-$ by the LO voltages $V_{LO}^+(I),V_{LO}^-(I)$ and the LO voltages $V_{LO}^+(I),V_{LO}^-(I)$, so as to obtain the differential components (referred to as IF currents) $I_{IF}^+(I)$ and $I_{IF}^-(I)$ of the in-phase component of a further intermediate current, and the differential components (again referred to as IF currents) $I_{IF}^+(Q)$ and $I_{IF}^-(Q)$ of the quadrature component of the further intermediate current—with the IF currents $I_{IF}^+(I)$ and $I_{IF}^-(I)$, and the IF currents, $I_{IF}^+(Q)$ and $I_{IF}^-(Q)$ that have a common mode component (equal to the common mode current $I_{CM}$).

The mixer 210 then includes a loading stage 320, which receives the IF currents $I_{IF}^+(I)$ and $I_{IF}^-(I)$, and the IF currents $I_{IF}^+(Q)$ and $I_{IF}^-(Q)$. The interface between the multiplication stage 315 and the loading stage 320 allows collecting an output signal consisting of the differential components (referred to as IF voltages) $V_{IF}^+(I)$ and $V_{IF}^-(I)$ of the in-phase component of an IF voltage, and the differential components (again referred to as IF voltages) $V_{IF}^+(Q)$ and $V_{IF}^-(Q)$ of the quadrature component of the IF voltage (defining the corresponding components $S_{IF}(I)$ and $S_{IF}(Q)$, respectively, of the IF signal)—with the IF voltages $V_{IF}^+(I)$ and $V_{IF}^-(I)$, and the IF voltages $V_{IF}^+(Q)$ and $V_{IF}^-(Q)$ that have a common mode component (referred to as output common mode $V_{CM}$).

Figure 4:
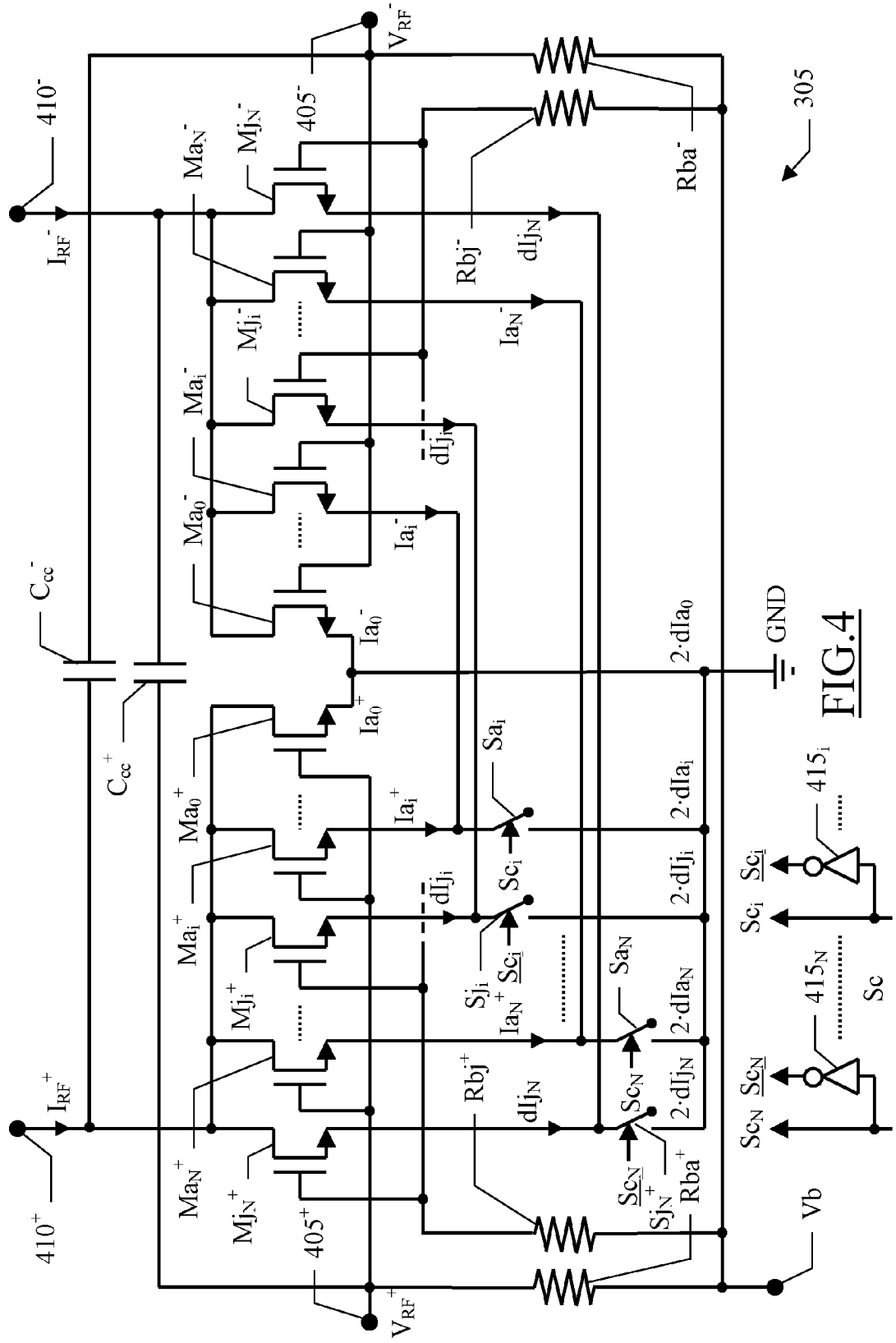
FIG. 4 shows a simplified circuit scheme of a transconductance stage of this mixer, according to an embodiment.

A simplified circuit scheme of the transconductance stage 305 (of this mixer) according to an embodiment is shown in FIG. 4.

Particularly, the transconductance stage 305 has a pair of input terminals 405⁺ and 405⁻ for receiving the RF voltages $V_{RF}^+$ and $V_{RF}^-$, respectively, and a pair of output terminals 410⁺ and 410⁻ for providing the RF currents $I_{RF}^+$ and $I_{RF}^-$, respectively. The transconductance stage 305 has a symmetric structure, with two identical (positive and negative transconductance) sections for processing the RF voltage $V_{RF}^+$ and the RF voltage $V_{RF}^-$, respectively. Each section includes a (main) amplifying transistor $Ma_0^+,Ma_0^-$ of the NMOS type and a set of (secondary) amplifying transistors $Ma_i^+,Ma_i^-$ of the NMOS type (with i=1 ... N, for example, N=1-5). All the amplifying transistors $Ma_0^+$-$Ma_i^+,Ma_0^-$-$Ma_i^-$ have their drain terminals coupled together to the output terminal 410⁺,410⁻. The amplifying transistor $Ma_0^+$ and the amplifying transistor $Ma_0^-$ have their source terminals coupled together to a ground terminal GND (for receiving a reference voltage, or ground). The amplifying transistors $Ma_i^+$ and $Ma_i^-$ of each pair have their source terminals coupled together to the ground terminal GND through a corresponding switch $Sa_i$. All the amplifying transistors $Ma_0^+$-$Ma_i^+,Ma_0^-$-$Ma_i^-$ have their gate terminals coupled together to the input terminal 405⁺,405⁻ (for receiving the RF voltage VRF⁺,VRF⁻ defining the input signal of the transconductance stage 305). A biasing resistor Rba⁺,Rba⁻ is coupled between the input terminal 405⁺,405⁻ and a biasing terminal Vb—for receiving a biasing voltage (for example, 0.55-0.65V) from a corresponding biasing circuit (not shown in the figure); the resistor Rba⁺,Rba⁻ has a relatively high resistance (for example, 5-10 kΩ), so as to provide a good isolation between the input terminals 405⁺,405⁻ (and then the RF voltages $V_{RF}^+$, $V_{RF}^-$ defining the input signal of the transconductance stage 305) and the biasing circuit. The amplifying transistor $Ma_0^+$, $Ma_0^-$ has a fixed transconductance gain $g_{ma0}$, and each one of the amplifying transistors $Ma_i^+,Ma_i^-$ has a fixed transconductance gain $g_{mai}$ (depending on their sizes).

In operation, the control block (not shown in the figure) enables the amplifying transistors $Ma_i^+,Ma_i^-$ selectively according to the desired value of the (total) transconductance gain $g_{mT}$ of the transconductance stage 305 (as defined by the control signal Sc); for this purpose, the control block closes the switches $Sa_i$ of the amplifying transistors $Ma_i^+,Ma_i^-$ to be enabled (so that they contribute to the total transconductance gain $g_{mT}$), while the switches $Sa_i$ of the other amplifying transistors $Ma_i^+,Ma_i^-$ are opened (so that they do not contribute to the total transconductance gain $g_{mT}$). For example, the control signal Sc comprises a bit $Sc_i$ for each amplifying transistor $Ma_i^+,Ma_i^-$, which bit $Sc_i$ is asserted or deasserted (for example, at the logic value 1 and 0, respectively) for closing or opening, respectively, the corresponding switch $Sa_i$. More formally, the total transconductance gain $g_{mT}$ is given by the following formula:

$$g_{mT} = g_{ma0} + \sum_{i=1}^{N} a_i \cdot g_{mai},$$

wherein $a_i$ is a Boolean value having the value 1 when the switch $Sa_i$ is closed and the value 0 when the switch $Sa_i$ is open. In this condition, the amplifying transistor $Ma_0^+,Ma_0^-$ provides a current $Ia_0^+,Ia_0^-$ and each one of the enabled amplifying transistors $Ma_i^+,Ma_i^-$ (corresponding switch $Sa_i$ closed) provides a current $Ia_i^+,Ia_i^-$ (proportional to their transconductance gain $g_{m0},g_{mi}$) to the output terminal $410^+$, $410^-$. Direct currents defining corresponding components of the currents $Ia_0^+,Ia_0^-$ (fixed) and $Ia_i^+,Ia_i^-$ (variable)—referred to as direct currents $$dIa_0 = \frac{Ia_0^+ + Ia_0^-}{2}$$

and $$dIa_i = \frac{Ia_i^+ + Ia_i^-}{2},$$

respectively—contribute to define the common mode current $I_{CM}$; therefore, the common mode current $I_{CM}$ varies according to the total transconductance gain $g_{mT}$, since the disabled amplifying transistors $Ma_i^+,Ma_i^-$ do not provide any contribution thereto. As above, the common mode current $I_{CM}$ is given by the following formula:

$$I_{CM} = dIa_0 + \sum_{i=1}^{N} a_i \cdot dIa_i.$$

In an embodiment, a compensation current (consisting of a direct current) is further provided; the compensation current is set according to the total transconductance gain $g_{mT}$ for compensating the corresponding variation of the common mode current $I_{CM}$ (according to the same control signal Sc). This compensation current is then added to the RF currents $I_{RF}^+$ and $I_{RF}^-$; in this way, the compensation current maintains the common mode current $I_{CM}$ substantially constant (as the total transconductance gain $g_{mT}$ changes). Particularly, in an exemplary implementation of an embodiment, each section of the transconductance stage 305 further includes a set of compensating (or injection) transistors $Mj_i^+,Mj_i^-$ of the NMOS type, each one for a corresponding amplifying transistor $Ma_i^+,Ma_i^-$. All the compensating transistors $Mj_i^+,Mj_i^-$ have their drain terminals coupled together to the output terminal $410^+,410^-$. The compensating transistors $Mj_i^+$ and $Mj_i^-$ of each pair have their source terminals coupled together to the ground terminal GND through a corresponding further switch $Sj_i$. All the compensating transistors $Mj_i^+,Mj_i^-$ have their gate terminals coupled together to the biasing terminal Vb through a further biasing resistor $Rbj^+,Rbj^-$ (with the same resistance of the resistor $Rba^+,Rba^-$)—but without any coupling to the input terminal $405^+,405^-$. Each compensating transistor $Mj_i^+,Mj_i^-$ has the same size of the corresponding amplifying transistor $Ma_i^+,Ma_i^-$ (and then the same DC transconductance).

In operation, the control block enables each compensating transistor $Mj_i^+,Mj_i^-$ selectively when the corresponding amplifying transistor $Ma_i^+,Ma_i^-$ is disabled; for this purpose, the control block closes the switches $Sj_i$ of the compensating transistors $Mj_i^+,Mj_i^-$ to be enabled (when the corresponding switches $Sa_i$ are open), while the switches $Sj_i$ of the other compensating transistors $Mj_i^+,Mj_i^-$ are opened (when the corresponding switches $Sa_i$ are closed). In the example at issue, the switches $Sj_i$ are controlled by the same control signal Sc being negated ($\overline{Sc}$), and more specifically by the corresponding negated bits $\overline{Sc_i}$ that are asserted or deasserted for closing or opening, respectively, the switches $Sj_i$; in this case, the transconductance stage 305 includes an inverter 415$_i$ for each switch $Sj_i$, which inverter generates the corresponding negated bit $\overline{Sc_i}$ from the bit $Sc_i$. In this condition, each enabled compensating transistor $Mj_i^+,Mj_i^-$ (corresponding switch $Sj_i$ closed) provides the same direct current $dIj_i = dIa_i$ (that should have been provided by the disabled amplifying transistor $Ma_i^+,Ma_i^-$) to the output terminal $410^+,410^-$. The direct currents $dIj_i$ provided by the enabled compensating transistors $Mj_i^+,Mj_i^-$ contribute to define the common mode current $I_{CM}$, in addition to the direct current $dIa_0$ provided by the amplifying transistor $Ma_0^+,Ma_0^-$ and the direct currents $dIa_i$ provided by the enabled amplifying transistors $Ma_i^+,Ma_i^-$; therefore, the common mode current $I_{CM}$ is maintained constant, since the direct current $dIa_i$ that is lost when any amplifying transistors $Ma_i^+,Ma_i^-$ are disabled is compensated for by the same direct current $dIj_i$ provided by the corresponding compensating transistors $Mj_i^+,Mj_i^-$ that are enabled. More formally, the common mode current $I_{CM}$ is now given by the following formula:

$$I_{CM} = dIa_0 + \sum_{i=1}^{N} a_i \cdot dIa_i + \sum_{i=1}^{N} \underline{a_i} \cdot dIj_i = dIa_0 + \sum_{i=1}^{N} dIa_i.$$

In this way, the common mode current $I_{CM}$ remains substantially constant even if the total transconductance gain $g_{mT}$ changes. Therefore, the multiplication stage (not shown in the figure) may be optimized for this (constant) common mode current $I_{CM}$, so as to minimize the flicker noise that is added to the IF current being output by the transconductance stage 305. At the same time, the stability of the common mode current $I_{CM}$ maintains constant the output common mode $V_{CM}$ as well; this avoids (or at least significantly reduces) linearity problems in the mixer and biasing problems in the downstream components of the receiver (since this constant output common mode $V_{CM}$ may now be used to bias the downstream components, so as to remove the need of any decoupling capacitors, with a corresponding saving of space).

All of the above has a beneficial effect on the noise and linearity performance of the (variable-gain) mixer, and then of the whole receiver.

This result is achieved without requiring any additional currents, and then without any significant increase of the power consumption; therefore, an embodiment of the proposed technique is well suited to low power applications.

The (additional) compensating transistors $Mj_i^+, Mj_i^-$ may increase the stray capacitance of the multiplication stage (which may limit its operative frequency); however, this is not generally a problem at RF frequencies up to 1 GHz.

As a further improvement, the transconductance stage 305 also includes a cross-coupling capacitor (or simply capacitor) $C_{cc}^+$ coupled between the input terminal 405$^+$ and the (complementary) output terminal 410$^-$, and a cross-coupling capacitor (or simply capacitor) $C_{cc}^-$ coupled between the input terminal 405$^-$ and the (complementary) output terminal 410$^+$; the capacitors $C_{cc}^+, C_{cc}^-$ have the same capacitance (for example, of the order of 0.2-0.4 pF).

In operation, the capacitor $C_{cc}^+$ ensures that a portion of the RF voltage $V_{RF}^+$ is introduced into the (complementary) output terminal 410$^-$ without any distortion, and the capacitor $C_{cc}^-$ ensures that a portion of the RF voltage $V_{RF}^-$ is introduced into the (complementary) output terminal 410$^+$ without any distortion. The RF current $I_{RF}^+, I_{RF}^-$ provided by the amplifying transistors $Ma_0^+, Ma_0^-$ and the enabled amplifying transistors $Ma_i^+, Ma_i^-$ is distorted because of their non-linearity; conversely, the portion of the RF voltage $V_{RF}^+, V_{RF}^-$ provided by the capacitors $C_{cc}^+, C_{cc}^-$ is undistorted (since they have a substantial constant transfer function given by the corresponding capacitance). Therefore, the overall distortion of the resulting signal at the output terminals 410$^+$,410$^-$ is significantly reduced. Moreover, this also increases the total transconductance gain $g_{mT}$ of the transconductance stage 305, and then the mixer gain Gv. This gain increase in the first stage of the mixer (i.e., the transconductance stage 305) further reduces the whole noise of the mixer.

The capacitors $C_{cc}^+, C_{cc}^-$ have a relatively low capacitance (since they should not filter the RF voltages $V_{RF}^+, V_{RF}^-$ at relatively high frequency), so that they are small and then do not significantly increase the size of the mixer. As above, the (additional) capacitors $C_{cc}^+, C_{cc}^-$ may increase the stray capacitance of the multiplication stage (which may limit its operative frequency); however, this is not generally a problem at RF frequencies up to 1 GHz.

Considering instead the multiplication stage of the mixer, it has a structure based on an active Gilbert cell that is known per se (so that its detailed description is omitted). Briefly, the multiplication stage has a quad structure, with two identical sectors for the in-phase component and the quadrature component of the signals, each one including two identical sections for processing the complementary components of the corresponding signal. Each section is based on a differential amplifier (for example, with a double-balanced structure), which is controlled by the corresponding LO signal $S_{LO}(I), S_{LO}(Q)$, and it is biased by the corresponding RF current $I_{RF}^+, I_{RF}^-$. The LO signal $S_{LO}(I), S_{LO}(Q)$ drives the differential amplifier so hard that the current being output is based on the product of the above-mentioned signals, so as to include a component with a frequency equal to the difference of their frequencies (which defines the desired IF current $I_{RF}^+, I_{RF}^-$) and another component with a frequency equal to the sum of their frequencies (that is filtered out by the next low-pass filter).

Figure 5:
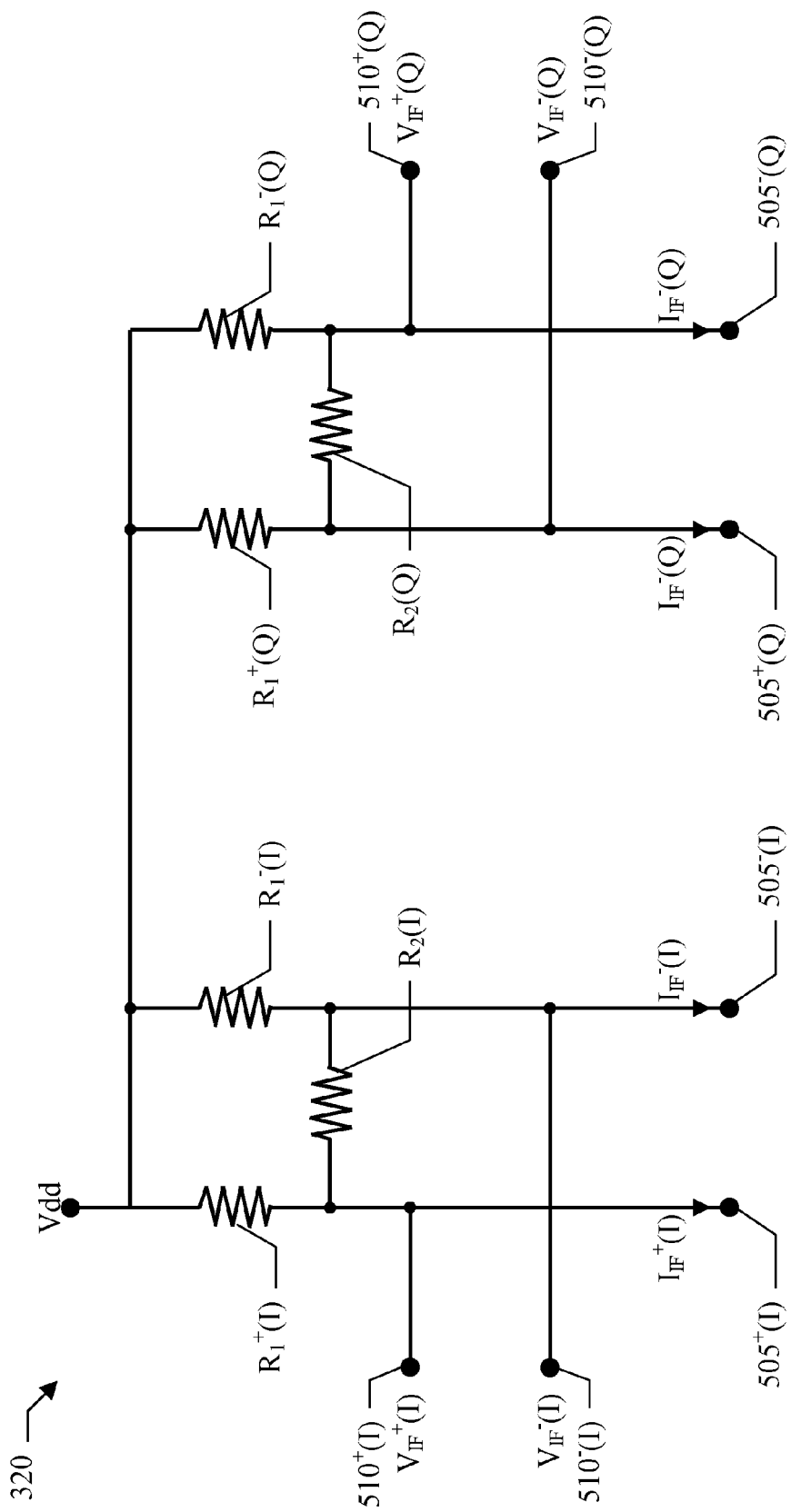
FIG. 5 shows a simplified circuit scheme of a loading stage of this mixer, according to an embodiment.

At the end, a simplified circuit scheme of the loading stage 320 (of this mixer) according to an embodiment is shown in FIG. 5.

Particularly, the loading stage 320 has a quad structure, with two identical sectors (each one with a differential structure) for the in-phase component and the quadrature component of the signals. The in-phase sector of the loading stage 320 has a pair of (loading) input terminals 505$^+$(I) and 505$^-$(I) for receiving the IF currents $I_{IF}^+(I)$ and $I_{IF}^-(I)$, respectively, and a pair of (loading) output terminals 510$^+$(I) and 510$^-$(I) for providing the IF voltages $V_{IF}^+(I)$ and $V_{IF}^-(I)$, respectively; likewise, the quadrature sector of the loading stage 320 has a pair of (loading) input terminals 505$^+$(Q) and 505$^-$(Q) for receiving the IF currents $I_{IF}^+(Q)$ and $I_{IF}^-(Q)$, respectively, and a pair of (loading) output terminals 510$^+$(Q) and 510$^-$(Q) for providing the IF voltages $V_{IF}^+(Q)$ and $V_{IF}^-(Q)$, respectively. The in-phase sector includes a (first) resistor $R_1^+(I)$ coupled between the input terminal 505$^+$(I) and a supply terminal Vdd (for receiving a power supply voltage—for example, 1.5-1.8V), and another (first) resistor $R_1^-(I)$ coupled between the input terminal 505$^-$(I) and the supply terminal Vdd; the resistor $R_1^+(I)$ and the resistor $R_1^-(I)$ have the same resistance (denoted with $R_1$). Moreover, a (second) resistor $R_2(I)$ (with a resistance $R_2$) is coupled between the input terminal 505$^+$(I) and the input terminal 505$^-$(I). Likewise, the quadrature sector includes two (first) resistors $R_1^+(Q)$ and $R_1^-(Q)$ (with the same resistance $R_1$) coupled between the input terminal 505$^+$(Q) and the supply terminal Vdd and between the input terminal 505$^+$(Q) and the supply terminal Vdd, respectively; moreover, a (second) resistor $R_2(Q)$ (with the same resistance $R_2$) is coupled between the input terminal 505$^+$(Q) and the input terminal 505$^-$(Q).

In operation, only the resistors $R_1^+(I)$-$R_1^-(I)$ and the resistors $R_1^+(Q)$-$R_1^+(Q)$ contribute to define the output common mode $V_{CM}$ of the voltages $V_{IF}^+(I)$-$V_{IF}^-(I)$ and of the voltages $V_{IF}^+(Q), V_{IF}^-(Q)$, respectively. Indeed, in this case the resistor $R_2(I), R_2(I)$ is not crossed by any current (since its voltage is equal to zero by definition); therefore, the output common mode $V_{CM}$ is given by:

$$V_{CM} = Vdd - R_1 \cdot I_{CM}/2$$

(since half the same common mode current $I_{CM}$ crosses each branch of the loading stage 320). On the other hand, all the resistors $R_1^+(I), R_1^-(I), R_2(I)$ and the resistors $R_1^+(Q), R_1^+(Q), R_2(Q)$ contribute to define the mixer gain Gv. Indeed, the mixer gain Gv is proportional to a total resistance $R_L$ of each branch of the loading stage 320—for example, in a simplified equation, $$Gv \square 20 \cdot \log\left(\frac{2}{\pi} \cdot g_{mT} \cdot R_L\right);$$

therefore, by splitting the resistor $R_2(I), R_2(Q)$ between the corresponding branches (into two resistors having half its resistance) and zeroing each direct voltage source, the total resistance $R_L$ is given by the parallel of the resistor $R_1(I), R_1(Q)$ and the halved resistor $R_2(I), R_2(Q)$:

$$\frac{1}{R_L} = \frac{1}{R_1} + \frac{1}{R_2/2}.$$

As a result, it is possible to fix the output common mode $V_{CM}$ independently of the mixer gain Gv. This allows having a relatively low output common mode $V_{CM}$ by using a relatively high resistance $R_1$, so as to avoid reducing the voltage that is available for the lower stages of the mixer (i.e., the transconductance stage and the multiplication stage, not shown in the figure) and then impairing the correct operation of their transistors (even when the power supply voltage Vdd is low—for example, 1.5-1.8V). Nevertheless, at the same time it is now possible to have a relatively low mixer gain Gv (even with a relatively high resistance $R_1$), by using a relatively low resistance $R_2$; this ensures a good linearity of the mixer and a correct output common mode $V_{CM}$ to bias the downstream components of the receiver (i.e., the low pass filter, not shown in the figure). Therefore, this technique allows optimizing the linearity at the local level of the mixer and avoiding the use of decoupling capacitors.

Naturally, in order to satisfy local and specific requirements, a person skilled in the art may apply to an embodiment described above many logical and/or physical modifications and alterations. More specifically, although one or more embodiments have been described with a certain degree of particularity, it should be understood that various omissions, substitutions and changes in the form and details as well as other embodiments are possible (for example, with respect to numerical values). Particularly, different embodiments may even be practiced without the specific details set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice.

For example, similar considerations apply if the mixer has a different structure or includes equivalent components, or it has other operative characteristics. In any case, every component thereof may be separated into more elements, or two or more components may be combined together into a single element; moreover, each component may be replicated to support the execution of the corresponding operations in parallel. It is also pointed out that (unless specified otherwise) any interaction between different components generally does not need to be continuous, and it may be either direct or indirect through one or more intermediaries.

Moreover, the proposed technique may be part of the design of an integrated circuit. The design may also be created in a hardware description language; moreover, if the designer does not manufacture chips or masks, the design may be transmitted by physical means to others. In any case, the resulting integrated circuit may be distributed by its supplier in raw wafer form, as a bare die, or in packages.

Nothing prevents injecting the compensation current in another position of the mixer (for example, by adding it to the IF current downstream the multiplication stage). Moreover, any other control signal (indicative of the selected mixer gain) may be used to control (directly or indirectly) the transconductance gain and the compensation current—for example, encoding the value of the mixer gain in binary form. In any case, the above-described structure for providing the compensation current is merely illustrative and in no way limitative (with the same result that may also be achieved with equivalent structures, even with a single element providing a controlled direct current).

Similar considerations apply if the structure based on NMOS transistors is replaced with a structure based on PMOS transistors, or on equivalent elements (for example, BJT transistors). In any case, the application of the same technique to a different amplifying stage (for example, receiving an RF current and/or providing an IF current) is contemplated.

An embodiment may also be applied to a transconductance stage with a different architecture (for example, of the folded type); moreover, it is possible to provide two or more main amplifying transistors that are always enabled.

The (amplifying and compensating) transistors of the transconductance stage may be biased in a different way (for example, with independent circuits for the amplifying transistors and the compensating transistors).

The possibility of applying the above-described technique to a single-ended structure is not excluded.

The cross-coupling capacitors may be replaced with any other inductances.

Alternatively, it is possible to implement only some of the additional features described above (for example, the cross-coupling capacitors between the transconductance stage and the multiplication stage, or the resistor network of the loading stage) in addition to the proposed technique based on the injection of the compensation current; in any case, these additional features are not strictly necessary, and they may also be omitted at all in a simplified implementation.

Vice-versa, the same additional features are suitable to be used (alone or combined with each other or with other additional features) even without the injection of the compensation current; for example, an alternative embodiment only provides the resistor network of the loading stage.

Similar considerations apply to the whole receiver. For example, the receiver may be implemented in a dedicated device (without any transmitter), or it may include two or more mixers. In any case, the use of an embodiment in other applications is not excluded (for example, in mobile telephones, pagers, routers, and the like).

Similar considerations apply if an embodiment is implemented with an equivalent method (by using similar steps with the same functions of more steps or portions thereof, removing some steps being non-essential, or adding further optional steps); moreover, the steps may be performed in a different order, concurrently or in an interleaved way (at least in part).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A variable-gain mixer for down-converting a modulated input signal into a modulated output signal in a wireless receiver, the mixer including:
    means for selecting a mixer gain according to a power level of the input signal,
    amplifying means for amplifying the input signal into a modulated intermediate current in response to a control signal indicative of the selected mixer gain, the intermediate current having an intermediate component, consisting of a direct current, varying according to the selected mixer gain,
    means for generating the output signal from the intermediate current, the output signal having an output component, consisting of a direct current or voltage, depending on the intermediate component,
    means for setting a compensation current in response to the control signal for compensating the variation of the intermediate component, and
    means for adding the compensation current to the intermediate current.

2. The mixer according to claim 1, wherein the amplifying means includes a switchable amplifier having a plurality of amplifying elements for contributing to amplify the input signal into the intermediate current, wherein the means for selecting includes means for selectively enabling at least part of the amplifying elements for providing the selected mixer gain, wherein the means for adding includes a plurality of compensating elements, each one contributing to the compensation current for a corresponding one of the amplifying elements, adapted to be enabled selectively, and wherein the means for setting includes means for enabling and disabling each compensating element when the corresponding amplifying element is disabled and enabled, respectively.

3. The mixer according to claim 2, wherein the switchable amplifier includes a transconductance stage, the input signal being an input voltage, and wherein each amplifying element and each compensating element includes an amplifying transistor and a compensating transistor, respectively, each one having a first conduction terminal, a second conduction terminal, and a control terminal, each amplifying transistor and each corresponding compensating transistor having an equal direct current transconductance.

4. The mixer according to claim 3, wherein the transconductance stage has at least one transconductance section each one including a transconductance input terminal for receiving a corresponding component of the input voltage, a transconductance output terminal for providing a corresponding component of the intermediate current ($I_{RF}^+$, $I_{RF}^-$) and a corresponding sub-set of the amplifying transistors including at least one main amplifying transistor and at least one secondary amplifying transistor, and wherein the means for adding includes a compensating transistor for each secondary amplifying transistor, in each transconductance section said at least one main amplifying transistor, said at least one secondary amplifying transistor and the corresponding compensating transistors having the first conduction terminals coupled to the transconductance output terminal, said at least one main amplifying transistor having the second conduction terminal coupled to a reference terminal for receiving a reference voltage, each one of said at least one secondary amplifying transistor having the second conduction terminal coupled to the reference terminal through a corresponding switch, each one of the corresponding compensating transistor having the second conduction terminal coupled to the reference terminal through a corresponding further switch, said at least one main amplifying transistor and said at least one secondary amplifying transistor having the control terminals coupled to the transconductance input terminal and to biasing means for receiving a biasing voltage, and the corresponding compensating transistors having the control terminals coupled to further biasing means for receiving said biasing voltage, wherein the means for selecting includes means for selectively controlling the switches, and wherein the means for setting includes means for selectively controlling the further switches.

5. The mixer according to claim 4, wherein the biasing means includes a biasing resistor coupled between a biasing terminal for receiving the biasing voltage and the control terminals of all the amplifying transistors, and wherein the further biasing means includes a further biasing resistor coupled between the biasing terminal and the control terminals of all the compensating transistors, the biasing resistor and the further biasing resistor having an equal resistance.

6. The mixer according to claim 4, wherein said at least one transconductance section is at least one transconductance differential pair of a positive transconductance section and a negative transconductance section, the components of the intermediate current in the positive and negative transconductance sections including a common mode current defining said intermediate component, the second conduction terminals of each pair of corresponding secondary amplifying transistors in the positive and negative transconductance sections being coupled to the reference terminal through a shared switch, and the second conduction terminals of each pair of corresponding compensating transistors being coupled to the reference terminal through a shared further switch.

7. The mixer according to claim 6, wherein the transconductance stage further includes a cross-coupling capacitor coupled between the transconductance input terminal of the positive transconductance section and the transconductance output terminal of the negative transconductance section, and a further cross-coupling capacitor coupled between the transconductance input terminal of the negative transconductance section and the transconductance output terminal of the positive transconductance section.

8. The mixer according to claim 1, wherein the means for generating the output signal includes a multiplication stage for providing a further intermediate current by multiplying the intermediate current by a local signal, and a loading stage for providing a modulated output voltage defining the output signal from the further intermediate current, and wherein the loading stage includes at least one loading differential pair of a positive loading section and a negative loading section each one including a loading input terminal for receiving a corresponding component of the further intermediate current, a loading output terminal for providing a corresponding component of the output voltage, the components of the output voltage in the positive and negative loading sections including a common mode voltage defining said output component, and a first resistor coupled between the loading output terminal and a supply terminal for receiving a power supply voltage, each loading differential pair further including a second resistor coupled between the loading output terminal of the positive loading section and the loading output terminal of the negative loading section.

9. A wireless receiver including at least one variable-gain mixer according to claim 1.

10. A method for down-converting a modulated input signal into a modulated output signal with a variable-gain mixer in a wireless receiver, the method including the steps of:
selecting a mixer gain according to a power level of the input signal,
amplifying the input signal into a modulated intermediate current in response to a control signal indicative of the selected mixer gain, the intermediate current having an intermediate component, consisting of a direct current, varying according to the selected mixer gain,
generating the output signal from the intermediate current, the output signal having an output component, consisting of a direct current or voltage, depending on the intermediate component,
setting a compensation current in response to the control signal for compensating the variation of the intermediate component, and
adding the compensation current to the intermediate current.

* * * * *